(12) United States Patent
Yokomichi et al.

(10) Patent No.: US 6,303,919 B1
(45) Date of Patent: Oct. 16, 2001

(54) LINEAR IMAGE SENSOR

(75) Inventors: Masahiro Yokomichi; Yukito Kawahara; Satoshi Machida; Tooru Shimizu, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/299,467

(22) Filed: Apr. 26, 1999

(30) Foreign Application Priority Data

Apr. 28, 1998 (JP) ................................................. 10-119647

(51) Int. Cl.[7] ................................................. H01L 27/148
(52) U.S. Cl. ........................ 250/208.1; 257/291; 348/307
(58) Field of Search ............................ 250/208.1, 208.2, 250/214 R; 348/294, 307, 308, 310; 257/291, 292, 293, 431

(56) References Cited

U.S. PATENT DOCUMENTS

| | | | |
|---|---|---|---|
| 4,562,474 | * 12/1985 | Nishizawa | 348/307 |
| 4,631,592 | * 12/1986 | Nishizawa | 348/307 |
| 4,673,985 | *  6/1987 | Nishuzawa | 348/307 |
| 5,844,234 | * 12/1998 | Kawazoe | 250/208.1 |

* cited by examiner

Primary Examiner—John R. Lee
(74) Attorney, Agent, or Firm—Adams & Wilks

(57) ABSTRACT

A light receiving element is provided with a phototransistor and a light receiving MOS diode proximate thereto and having a gate electrode covering a portion of the base region of the phototransistor. The gate electrode permits transmission of a portion of received light. The light receiving MOS diode forms an inversion layer in a substrate adjacent the base of a phototransistor during the time photo charges are stored, and generated photo charges are stored in the inversion region and the base region of the phototransistor. During the storage state, the potential of the inversion region and the base region of the phototransistor is limited, so that the intensity of an electric field applied to an insulating film between the electrode and the semiconductor substrate is 0.7 MV/cm or less. Alternatively, the potential of the electrode in a waiting state is fixed or made floating, so that an electric field is not applied, and recombination at the surface of the semiconductor substrate is made stable.

15 Claims, 9 Drawing Sheets

Φ Sch

LINEAR IMAGE SENSOR

BACKGROUND OF THE INVENTION

The present invention relates to a linear image sensor suitable for a facsimile or an image scanner which reads out image information and transmits it.

In a conventional linear image sensor, a light receiving element of a linear image sensor as disclosed in Japanese Patent Application Laid-open No. Sho 61-124171 is known. FIG. 8 shows its structure. In FIG. 8, reference numeral 4 denotes a separation layer, 3 denotes an epitaxial layer and is a collector, 6 denotes a base, and 9 denotes an emitter.

SUMMARY OF THE INVENTION

However, since a base/collector junction portion is wide, junction capacitance is also large, and further, since a base region is in a floating state, there is a problem of persistence of vision that even if read images are changed from a bright state to a dark state, a signal of the previous bright state remains in the read signal, and there has been a problem that a clear image can not be obtained.

In order to solve the foregoing problem, in the present invention, a part of a light receiving element is made a light receiving MOS diode covered with an electrode permitting transmission of part of light, and when photo charges are stored, the light receiving MOS diode is operated in an inversion state, and generated photo charges are stored in its inversion region and a base region of a phototransistor, and at the time of resetting after reading to the outside, the light receiving MOS diode is made a storage state so that residual charges which were not able to be read to the outside are transferred to the base region, and in the state where the photo charge density of the base region is raised, resetting is made through an emitter so that the residual charges which become persistence of vision are reduced. At the time of reading as well, the light receiving MOS diode is made the storage state, so that photo charges stored under the light receiving MOS diode are transferred to the base region and the voltage between the base and emitter is made large, as a result of which, the bipolar transistor operation of the phototransistor is made easier, and improvement has been made to the characteristics contrary to the foregoing, that is, the rising characteristics that even when read images are changed from a dark state to a bright state, a read signal is slightly lower than a signal in a sufficiently bright state.

Moreover, to prevent an electric field of 0.7 MV/cm or more from being applied to a gate oxide film of the light receiving MOS diode, a base potential is limited, so that the influence of surface recombination current applied by an interface of the gate oxide film is stabilized, and further, improvement has been made to the leak of photo charges, which were not able to be absorbed, into the vicinity of an adjacent pixel in the case where light with high illumination is incident on a pixel under sunlight or fluorescent light. Moreover, at a waiting state, the potential of a gate of the light receiving MOS diode is fixed to a high voltage or made floating, so that improvement has been made such that an electric field is prevented from being applied to the gate oxide film of the light receiving MOS diode.

DESCRIPTION OF THE PREFERRED EMBODIMENTS

Figure 1:
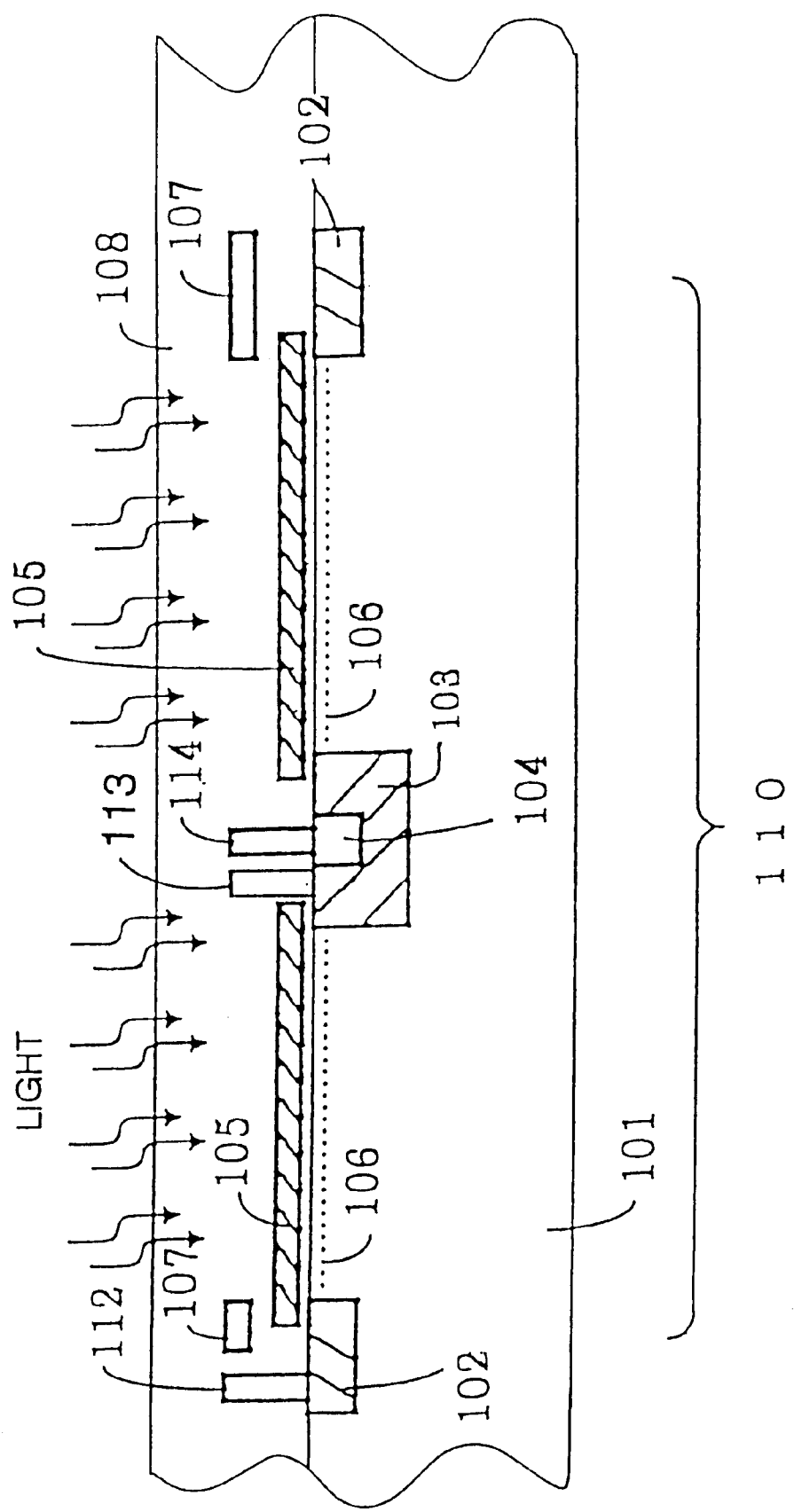
FIG. 1 is a sectional structural view of a light receiving element of a linear image sensor of the present invention.

Embodiments of the present invention will be described in detail with reference to the drawings. FIG. 1 is a sectional structural view of a light receiving element of a linear image sensor showing an embodiment of the present invention. Reference numeral 101 denotes an n-type silicon semiconductor substrate, 102 denotes an n-type region which has a high impurity concentration and is formed to apply a potential to the semiconductor substrate, 112 denotes its metal electrode, 103 denotes a p-type base region of a bipolar phototransistor, 113 denotes its metal electrode, 104 denotes an n-type emitter region of the bipolar phototransistor, 114 denotes its metal electrode, and 105 denotes a gate electrode of a light receiving MOS diode, which is made of polycrystal silicon or the like to permit transmission of at least a part of light. Reference numeral 106 denotes an inversion region at the time when a positive potential is applied to the gate electrode 105 of the light receiving MOS diode so that the surface of the n-type silicon semiconductor substrate 101 becomes an inversion state, and the n-type silicon semiconductor substrate 101 becomes a substrate region of the light receiving MOS diode and a collector region of the phototransistor. Reference numeral 107 denotes a light-shielding film, 108 denotes a transparent protective film to permit transmission of light, and 110 denotes a light receiving element region where the phototransistor and the light receiving MOS diode are formed. When the light receiving element region 110 is irradiated with light in a storage period when an original image is read, holes of photo charges generated in the n-type silicon semiconductor substrate 101 are stored in the base 103 and the inversion region 106. Here, in the case where the inversion region 106 is not formed, although a part of the holes of the generated photo charges reaches the base 103 in the light receiving element region 110 and is stored, the remainder does not reach the base 103 and disappears, or is diffused or drifted to another light receiving element region or negative potential region in the vicinity, and as a result, the photo charges generated in the light receiving element region are not sufficiently stored in the light receiving element, and it becomes impossible to read them to the outside. When the inversion region 106 is formed under the light receiving MOS diode and charges are stored, it has become possible to obtain a photoelectric conversion efficiency comparable with a conventional light receiving element composed of a phototransistor having a wide base region. After the operation of storage, although an image signal is read out to the outside, at the time of resetting after reading to the outside, a positive potential is applied to the gate electrode 105, so that the surface of the n-type silicon semiconductor substrate 101 under the light receiving MOS diode is made a storage state from the inversion state. By doing so, the residual charges which were not able to be read to the outside are transferred to the base region 103, and in the state where the photo charge density of the base region is raised, resetting to a reset potential is made through the emitter 104, so that the residual charges which become persistence of vision are decreased. At the time of reading as well, the surface of the n-type silicon semiconductor substrate 101 under the light receiving MOS diode is made the storage state so that holes of photo charges previously stored in the inversion region 106 are transferred to the base region 103, and a voltage between the base and emitter is increased so that the bipolar transistor operation of the phototransistor is made easier, as a result of which, improvement has been made to the characteristics contrary to the foregoing problem of the persistence of vision, that is, the characteristics of rising from dark to bright that when read images are changed from the dark state to the bright state, the read signal is slightly smaller than the signal in the sufficiently bright state.

Besides, by making the conductivity of the inversion region 106 of the light receiving diode equal to the conductivity of the base 103 of the phototransistor, the number of elements constituting a unit light receiving element is made small. Besides, in order to certainly transfer the photo charges stored in the inversion region 106 under the light receiving MOS diode to the base of the phototransistor, the gate electrode 105 of the light receiving MOS diode is made to cover at least a part of the base of the phototransistor through an insulating film.

Figure 2:
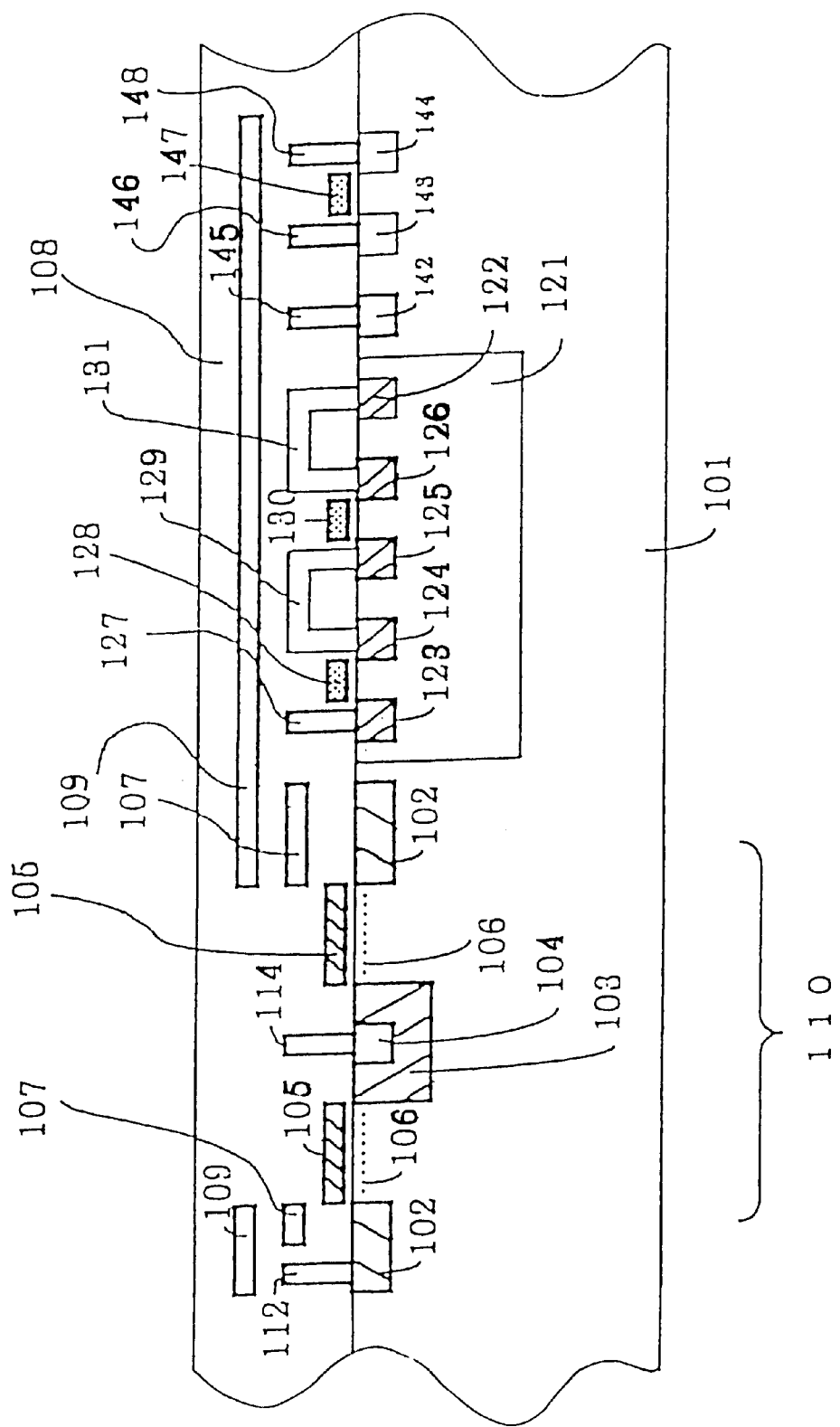
FIG. 2 is a sectional structural view of a light receiving element and a switching element of the linear image sensor of the present invention.

FIG. 2 is a sectional structural view showing another embodiment of the present invention, which includes a switching element and a reset element made of a MOS transistor. In addition to the light receiving element region 110 shown in FIG. 1, reference numeral 109 denotes a metal thin film for light-shielding, 121 denotes a p well with conductivity different from the n-type silicon semiconductor substrate 101, 123 and 124 denote a drain region and a source region of a switching n-channel MOS transistor formed in the p well 121, 128 denotes a gate electrode of the MOS transistor, and 127 denotes a lead electrode from the drain region 123, which is connected to the metal electrode 114 of the emitter 104 and has the same potential. Reference numerals 125 and 126 denote a drain region and a source region of a reset n-channel MOS transistor formed in the p well 121, 130 denotes a gate electrode of the MOS transistor, and 131 denotes a lead electrode from the source region 126, which is connected to a diffusion region 122 to give the Gnd potential as a reset potential. This diffusion region 123 has the same conductivity as the p well 121, and gives a potential also to the p well. The source region 124 of the switching MOS transistor is connected to the drain region 125 of the reset MOS transistor through a metal wiring line 129. The metal wiring line 129 is also connected to a circuit which reads a signal obtained by the light receiving element to the outside. By doing so, at the time of reading and resetting, the gate electrode 105 of the light receiving MOS diode can be connected to the gate electrode 128 of the switching n-channel MOS transistor, and at the time of storing photo charges, the gate electrode 105 of the light receiving MOS diode and the gate electrode 128 of the switching n-channel MOS transistor are made a negative potential at the same time to form the inversion region 106, and the switching MOS transistor is made a non-conduction state, so that the photo charges can be stored in the base 103 and the inversion region 106. At the time of reading and resetting, the gate electrode 105 of the light receiving MOS diode and the gate electrode 128 of the switching n-channel MOS transistor are made a positive potential at the same time, the switching n-channel MOS transistor is made a conduction state, the inversion region 106 under the light receiving MOS diode is changed to the storage region, the photo charges stored in the inversion region 106 are transferred to the base region 103, and the voltage between the base and emitter is raised, so that reading and resetting are made easier. At this time, since such a structure is adopted that the gate electrode 105 of the light receiving MOS diode covers at least a part of the base region 103 of the phototransistor through an insulating film, the photo charges stored in the inversion region 106 can be certainly transferred to the base region 103, so that uniform photoelectric conversion efficiency can be obtained among a plurality of light receiving elements. From the above, the gate electrode 105 of the light receiving MOS diode and the gate electrode 128 of the switching n-channel MOS transistor can be controlled by the same scanning circuit, so that the number of elements constituting the circuit of the linear image sensor can be reduced. That is, the switching MOS transistor for reading a signal from the light receiving element to the outside is formed on the substrate with conductivity different from conductivity of the substrate on which the light receiving MOS diode is formed, and the gate electrode is made common, so that the circuit scale can be made small, and uniform photoelectric conversion efficiency among a plurality of light receiving elements are obtained. Incidentally, the reset operation is made in such a manner that after reading is ended, while the switching MOS transistor is made to keep the conduction state, the reset MOS transistor is made the conduction state from the non-conduction state at the time of reading, and a reset potential is applied to the emitter 102 of the phototransistor through the reset MOS transistor and the switching MOS transistor. For convenience, although the description has been made while using the n-type silicon semiconductor substrate 101, a p-type silicon semiconductor substrate may be used. Although polycrystal silicon is used for the gate electrode 105 of the light receiving MOS diode, a transparent conductive thin film of ITO or the like may be used.

Figure 3:
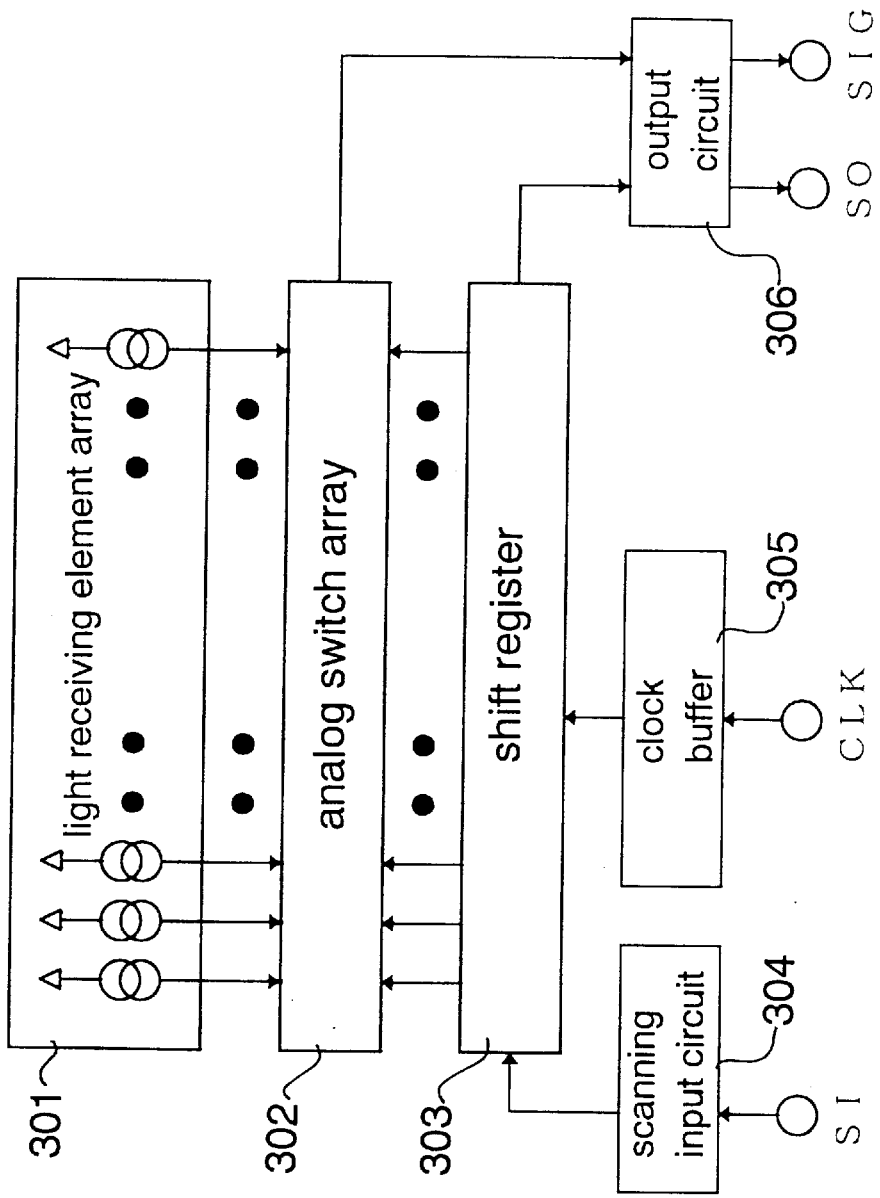
FIG. 3 is a block diagram of a linear image sensor of the present invention.

FIG. 3 is a block diagram showing an embodiment of the present invention, which includes a light receiving element array 301 composed of a plurality of phototransistors, an analog switch array 302 composed of a plurality of switching elements, a shift register 303 as a scanning circuit, a scanning input circuit 304 and a clock buffer 305 for driving the shift register, and an output circuit 306 for outputting an output signal of the scanning circuit and an image signal obtained in the light receiving element.

Figure 4A:
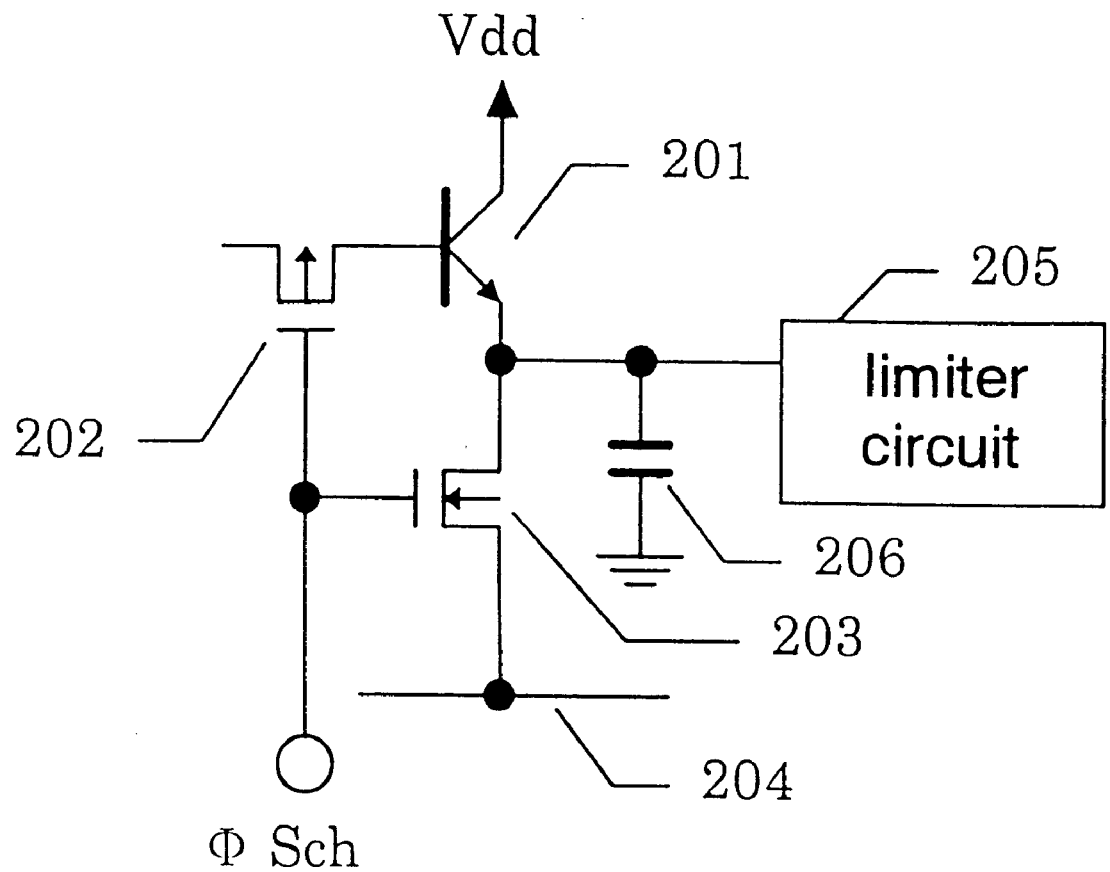
FIG. 4A is a first circuit diagram of a light receiving element of a linear image sensor of the present invention.

FIG. 4A is a first circuit diagram of a light receiving element of a linear image sensor showing an embodiment of the present invention. A unit light receiving circuit is structured in the manner described below. A collector electrode of a phototransistor 201 as a light receiving element is connected to a power source voltage VDD, and a base region of the phototransistor 201 is connected to a first electrode of a p-channel MOS transistor 202 of a light receiving MOS diode through a common diffusion region. The first electrode of the MOS transistor 202 is floating. A first electrode of a switching n-channel MOS transistor 203 and a limiter circuit 205 are connected to an emitter region of the phototransistor 201. A second electrode of the MOS transistor 203 is connected to a common signal line 204. A third electrode gate of the MOS transistor 202 and a third electrode gate of the MOS transistor 203 are connected to ΦSch. When ΦSch becomes low, the MOS transistor 203 is turned off, and the MOS transistor 202 is turned on, so that a storage period starts. Here, when the phototransistor 201 is irradiated with light, like FIG. 1, holes of photo charges generated in the n-type silicon semiconductor substrate are stored in the base 103 and the inversion region 106. However, in the case where irradiation of intense light is made, although a part of holes of the generated photo charges reach the base 103 in the light receiving element region 110 and are stored, the remainder is diffused or drifted to another light receiving element or negative potential region in the vicinity. Besides, the generated recombination center of the interface of the insulating film between the gate electrode 105 of the light receiving MOS diode and the inversion region 106 influences the amount of stored photo charge, and becomes an unstable factor for photoelectric characteristics. In order to prevent this, a potential Vbc of the base 103 and the inversion region 106 is made 2.5 V at the maximum. By this, the maximum electric field intensity in the insulating film becomes 0.7 MV/cm or less, and the amount of electric charge flowing in the film is suppressed. FIG. 4A shows a case where a voltage of the emitter region of the phototransistor 201 is limited, and when a voltage between the base and collector of the phototransistor 201 is Vbc, a capacitance between the base and collector is Cbc, a current amplification coefficient is hfe, and a capacitance value of wiring capacitance 206 is CL, a limit voltage Vlim of the limiter circuit 205 is set so as to be expressed by the following equation.

$$Vlim = Vbc/(1 + CL/hfe \cdot Cbc) = 2.5/(1 + CL/hfe \cdot Cbc)$$

Figure 4B:
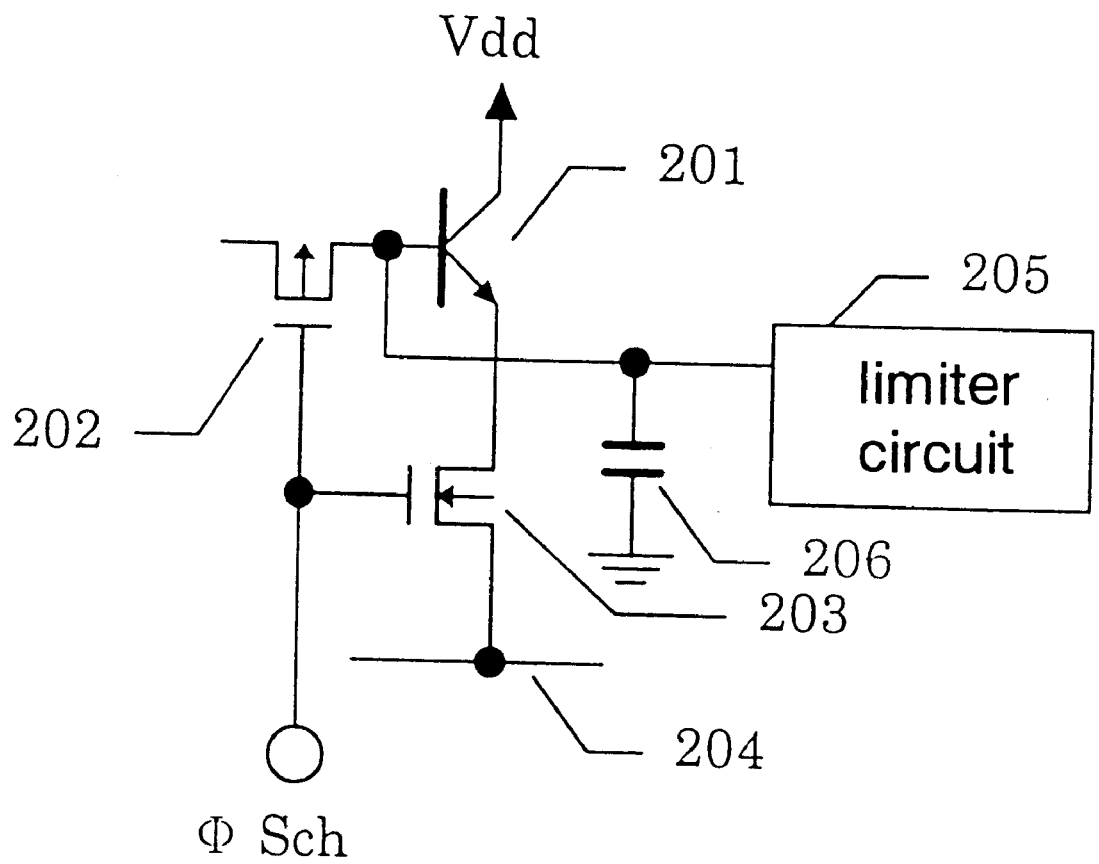
FIG. 4B is a second circuit diagram of a light receiving element of a linear image sensor of the present invention.

FIG. 4B is a second circuit diagram of a light receiving element of a linear image sensor showing an embodiment of the present invention. Like this, such a structure is adopted that the voltage of the base region of the phototransistor 201 is directly controlled. For convenience, although the explanation has been made on the case where the light receiving MOS diode has the electrode, it is also acceptable to make such a case that the light receiving MOS diode has no gate and the base region of the phototransistor 201 is floating, and it is possible to suppress diffusion or drift of photo charges to another light receiving element region or negative potential region in the vicinity.

Figure 5A:
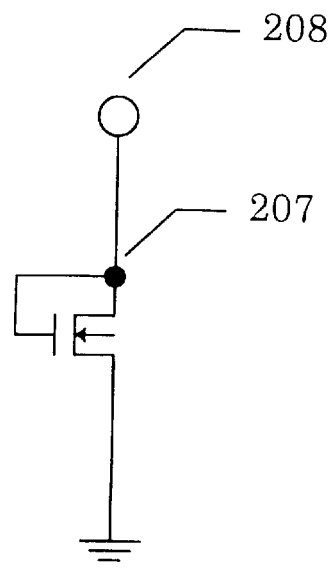
FIG. 5A is a first circuit diagram of a limiter circuit of a linear image sensor of the present invention.
Figure 5B:
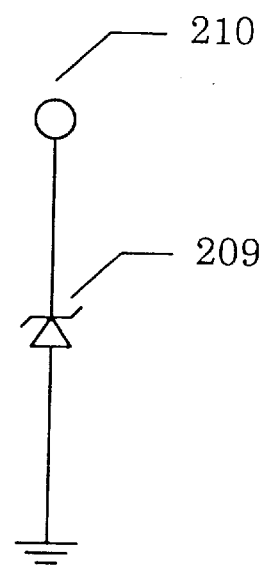
FIG. 5B is a second circuit diagram of a limiter circuit of a linear image sensor of the present invention.

FIG. 5A is a first circuit diagram of a limiter circuit of a linear image sensor showing an embodiment of the present invention. A source of an n-channel MOS transistor 207 and a substrate are connected to the GND, a gate electrode and a drain electrode are connected to a terminal 208, and the voltage between the terminal 208 and the GND is limited. The added threshold voltage of this MOS transistor 207 becomes the limit voltage Vlim. In this case, since a unit light receiving circuit includes one MOS transistor, the area of a cell can be reduced. FIG. 5B is a second circuit diagram of a limiter circuit of a linear image sensor showing an embodiment of the present invention. A p-type region of a diode 209 formed of a pn junction is connected to the GND, an n-type region is connected to a terminal 210, and the voltage between the terminal 209 and the GND is limited.

Figure 5C:
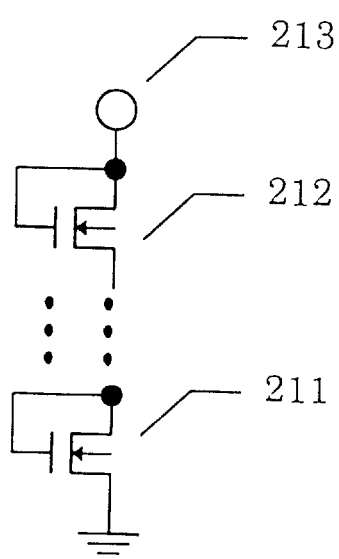
FIG. 5C is a third circuit diagram of a limiter circuit of a linear image sensor of the present invention.

The breakdown voltage of this diode in a reverse direction becomes the limit voltage Vlim. FIG. 5C is a third circuit diagram of a limiter circuit of a linear image sensor showing an embodiment of the present invention. Plural stages of n-channel MOS transistors are connected in series to each other, and only in a MOS transistor 211, a source and a substrate are connected to the GND, and a gate electrode is connected to a drain electrode. A source of some n-channel MOS transistor between the MOS transistor 211 and a terminal 213 is connected to a drain of a next n-channel MOS transistor. A gate electrode and a drain electrode of an n-channel MOS transistor 212 at the side nearest the terminal are connected to the terminal 213, and the voltage between the terminal 213 and the GND is limited. The threshold voltage for the number of stages of the MOS transistors from the MOS transistor 211 becomes the limit voltage Vlim. Thus, the circuit of FIG. 5A can be constructed by the same diffusion as a C-MOS region like FIG. 2, FIG. 5B can be constructed by N-channel MOS transistors with the same threshold voltage, and formation can be made without change of the number of process steps.

Figure 6:
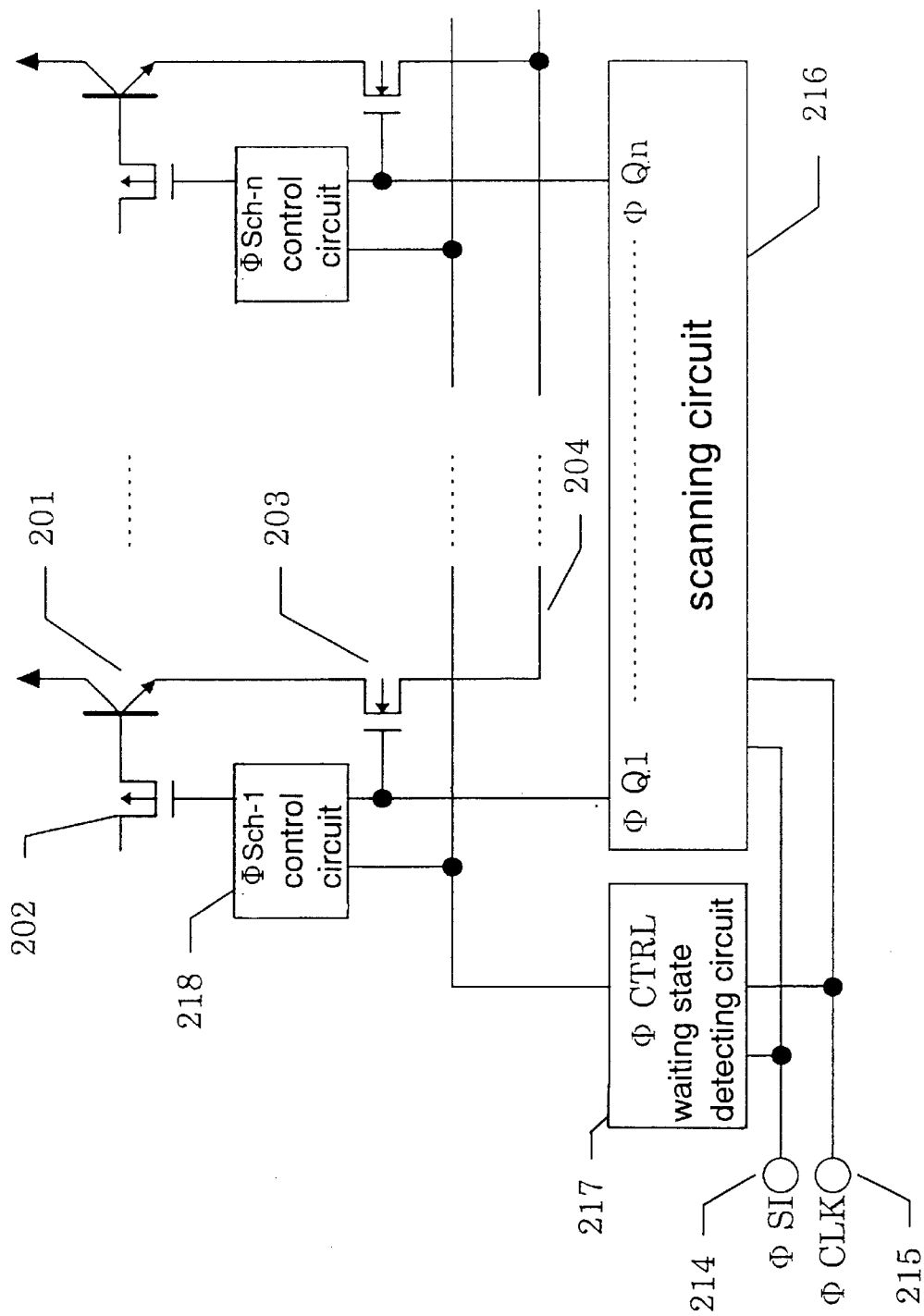
FIG. 6 is a circuit diagram of a linear image sensor showing a second embodiment of the present invention.

FIG. 6 is a circuit diagram of a linear image sensor showing a second embodiment of the present invention. This is constituted by a phototransistor 201 and a p-channel MOS transistor 202 of a light receiving MOS diode for reading image information, a switching n-channel MOS transistor 203 for reading a signal obtained by the phototransistor 201 and the MOS transistor 202 to the outside, a scanning circuit 216 for driving a shift register by receiving a start pulse ΦSI inputted from a terminal 214 for scanning and by receiving a clock ΦCLK inputted from a terminal 215 for scanning, a waiting state detecting circuit 217 for detecting a waiting state by receiving the start pulse ΦSI inputted from the terminal 214 for detection of the waiting state and by receiving the clock ΦCLK inputted from the terminal 215 for detection of the waiting state, and a control circuit 218 for controlling the MOS transistor 202 by receiving a control pulse ΦCTRL outputted from the waiting state detecting circuit 217. Here, there are included blocks each having the same structure as the block of a unit light receiving circuit constituted by the phototransistor 201, the MOS transistor 202, the MOS transistor 203, and the control circuit 218, the number of blocks being equal to at least that of output bits.

Figure 7A:
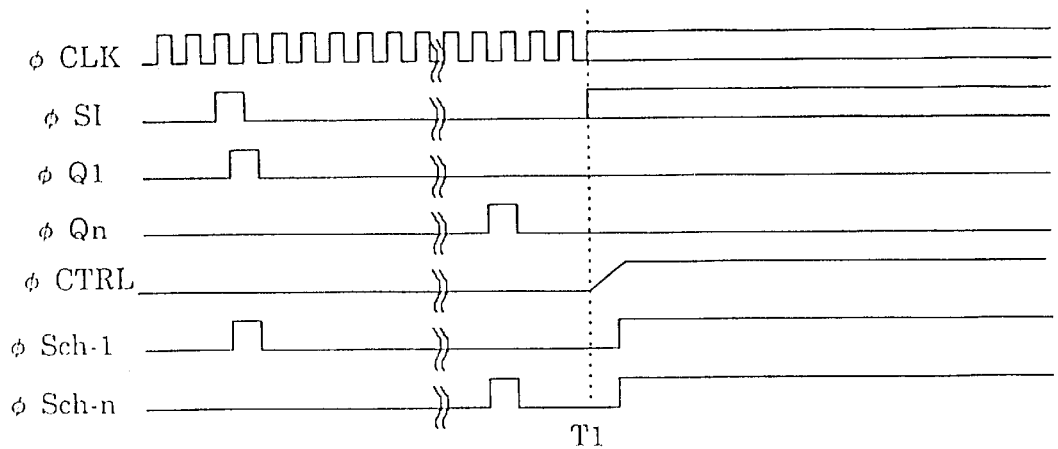
FIG. 7A is a first time chart diagram of a unit light receiving element of a linear image sensor showing a second embodiment of the present invention.
Figure 7B:
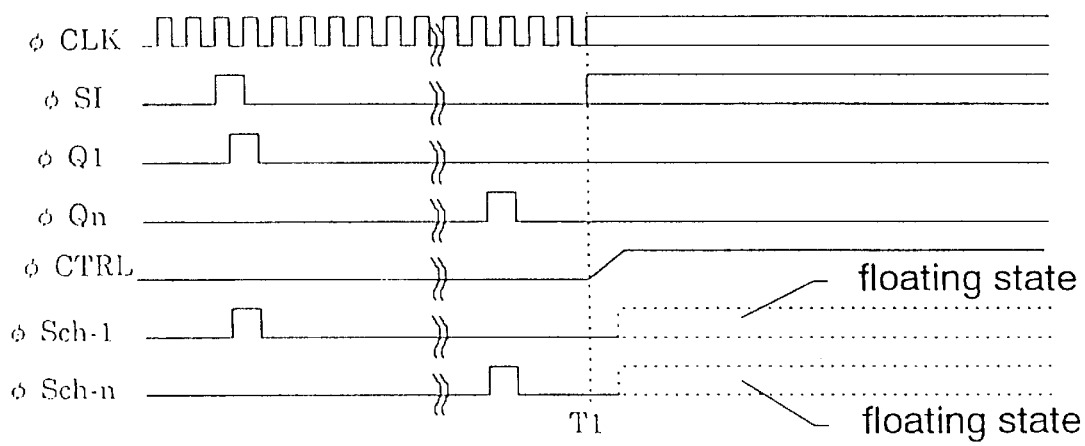
FIG. 7B is a second time chart diagram of the unit light receiving element of the linear image sensor showing the second embodiment of the present invention.
Figure 8:
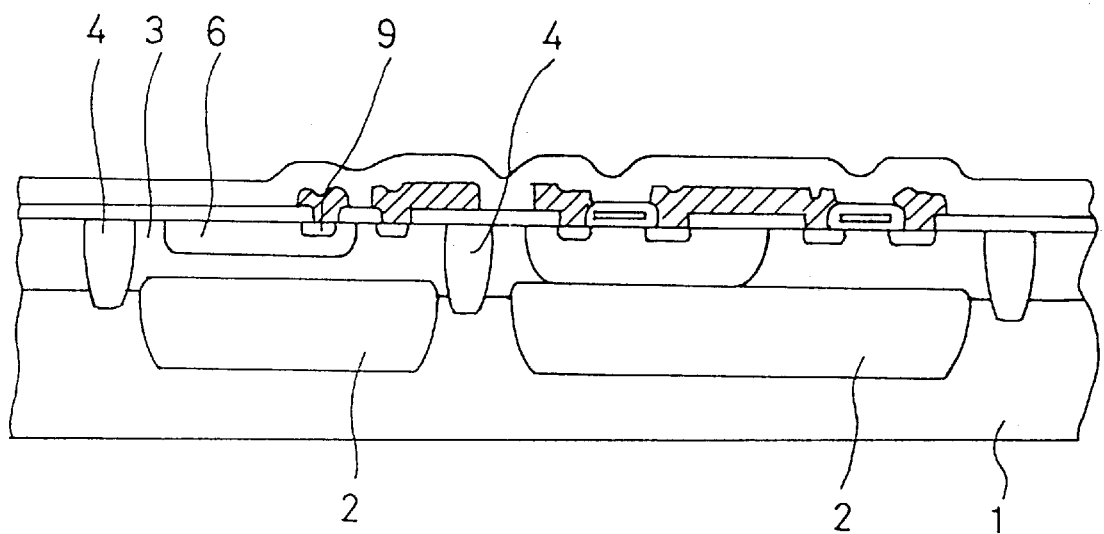
FIG. 8 is a sectional structural view of a light receiving element of a conventional linear image sensor.

FIG. 7A is a first time chart diagram of a unit light receiving element of the linear image sensor showing the second embodiment of the present invention. When the start signal ΦSI is inputted, synchronously with the clock pulse ΦCLK, ΦSch-1 to ΦSch-n are sequentially inputted to the gate of the MOS transistor 202, and in the same manner, synchronously with the clock pulse ΦCLK, ΦQ1 to ΦQn are sequentially inputted to the gate of the MOS transistor 203, and the output of the phototransistor 201 of each bit is read to the common signal line 204. When the output of all bits is ended, a waiting state starts from a period Ti, and the potentials of the clock pulse ΦCLK and the start signal ΦSI are fixed to VDD and GND, and when the control pulse ΦCTRL of the waiting state detecting circuit 217 becomes high, ΦSch-1 to ΦSch-n become high, and VDD is given to the gate of the MOS transistor 202. By this, like FIG. 1, an electric field comes not to be applied to the interface of the insulating film of the gate electrode 105 of the light receiving MOS diode. FIG. 7B is a second time chart view of a unit light receiving element of the linear image sensor showing the second embodiment of the present invention. A waiting state starts from a period T1, and when the potentials of the clock pulse ΦCLK and the start signal ΦSI are fixed to VDD and GND, and when the control pulse ΦCTRL of the waiting state detecting circuit 217 becomes high, ΦSch-1 to ΦSch-n become floating, and the gate of the MOS transistor 202 becomes floating. By this, like FIG. 1, an electric field comes not to be applied to the interface of the insulating film of the gate electrode 105 of the light receiving MOS diode. For convenience, although the explanation has been made on the case where the control pulse ΦCTR-L is high in the waiting state, it is also possible to control ΦSch-1 to ΦSch-n by making low in the waiting state and high in other states.

As described above, by using the present invention, charges remaining in the base region of the phototransistor after reading were decreased and characteristics of persistence of vision were improved.

Moreover, by using the present invention, the characteristics of persistence of vision were improved, and it was possible to keep photoelectric conversion efficiency.

Moreover, by using the present invention, it was possible to reduce the capacitance between base and collector, it became easy to read signal charges, and it was also able to improve the rising characteristics at the time when the dark state was changed to the bright state.

Moreover, by using the present invention, it was possible to improve the uniformity of photoelectric conversion efficiency among a plurality of light receiving elements.

Moreover, by using the present invention, it was possible to decrease the number of elements of the scanning circuit, and to realize the inexpensive linear image sensor.

Moreover, by using the present invention, it was possible to reduce crosstalk between light receiving elements due to intense external light, and it was possible to suppress the surface recombination of the interface of the insulating film between the gate electrode of the light receiving MOS diode and the inversion region.

What is claimed is:

1. A linear image sensor comprising: a plurality of bipolar phototransistors linearly arranged on a semiconductor substrate for reading out image information; switching elements each connected to a respective one of the phototransistors at an input terminal to read out a signal obtained by the phototransistor; a scanning circuit for driving control terminals of the plurality of switching elements; and a light receiving MOS diode disposed near each of the phototransistors and covered with a gate electrode permitting transmission of at least a part of received light.

2. A linear image sensor according to claim 1; further comprising a limiter circuit for limiting a base potential of each of the phototransistors.

3. A linear image sensor according to claim 2; wherein the base potential of each of the phototransistors is 2.5 V or less.

4. A linear image sensor according to claim 1; further comprising a limiter circuit for limiting an emitter potential of each of the phototransistors.

5. A linear image sensor according to claim 4; wherein the emitter potential of each of the phototransistors is 2.5 V or less.

6. A linear image sensor according to claim 1; further comprising a limiter circuit for fixing a potential of the gate electrode permitting transmission of at least a part of received light at a time of non-operation.

7. A linear image sensor according to claim 1; further comprising a limiter circuit for controlling a potential of the gate electrode permitting transmission of at least a part of received light to become floating at a time of non-operation.

8. A linear image sensor comprising: a plurality of bipolar phototransistors formed in a semiconductor substrate for reading out image information; a light receiving MOS diode disposed proximate each of the phototransistors and having a gate electrode that partially overlaps a base of the phototransistor to permit transmission of a portion of received light therethrough; a plurality of switching elements each connected to a respective one of the phototransistors at an input terminal thereof to read out an image signal produced by the phototransistor in response to incident light; and a scanning circuit for driving terminals of the switching elements to sequentially read out signals from the phototransistors.

9. A linear image sensor according to claim 8; wherein the gate electrode of the light receiving MOS diode produces an inversion region in the semiconductor substrate in response to an applied voltage.

10. A linear image sensor according to claim 8; further comprising a limiter circuit for limiting a base potential of each of the phototransistors.

11. A linear image sensor according to claim 10; wherein the limiter circuit limits the base potential of each of the phototransistors to 2.5 V or less.

12. A linear image sensor according to claim 8; further comprising a limiter circuit for limiting an emitter potential of each of the phototransistors.

13. A linear image sensor according to claim 12; wherein the limiter circuit limits the emitter potential of each of the phototransistors to 2.5 V or less.

14. A linear image sensor according to claim 8; further comprising a limiter circuit for fixing a potential of the gate electrode at a time of non-operation so as to permit transmission of at least a portion of received light.

15. A linear image sensor according to claim 8; further comprising a limiter circuit for controlling a potential of the gate electrode to become floating at a time of non-operation so as to permit transmission of at least a portion of received light.

\* \* \* \* \*